United States Patent [19]

Kurtz et al.

[11] Patent Number: 4,764,747
[45] Date of Patent: Aug. 16, 1988

[54] GLASS HEADER STRUCTURE FOR A SEMICONDUCTOR PRESSURE TRANSDUCER

[75] Inventors: Anthony D. Kurtz, Teaneck; Joseph R. Mallon, Franklin Lakes; Timothy A. Nunn, Ridgewood, all of N.J.

[73] Assignee: Kulite Semiconductor Products, Inc., Leonia, N.J.

[21] Appl. No.: 124,089

[22] Filed: Nov. 23, 1987

Related U.S. Application Data

[63] Continuation of Ser. No. 746,332, Jun. 19, 1985, abandoned.

[51] Int. Cl.⁴ .................................................. G01L 1/22
[52] U.S. Cl. .......................................... 338/2; 338/4; 338/5; 29/631.1
[58] Field of Search .................................. 338/2–5, 338/22 R, 225 D, 25; 29/631, 610 SG; 73/726, 727; 361/400–405, 408, 410

[56] References Cited

U.S. PATENT DOCUMENTS

| | | | |
|---|---|---|---|
| 3,654,579 | 4/1972 | Kurtz et al. | 338/2 |
| 3,697,917 | 10/1972 | Orth et al. | 338/4 X |
| 3,817,107 | 6/1974 | Shimada et al. | 338/4 |
| 4,019,388 | 4/1977 | Hall, II et al. | 338/4 X |
| 4,040,297 | 8/1977 | Karsmakers et al. | 338/4 X |
| 4,394,711 | 7/1983 | Conley | 361/408 |

Primary Examiner—E. A. Goldberg
Assistant Examiner—M. M. Lateef
Attorney, Agent, or Firm—Arthur L. Plevy

[57] ABSTRACT

A glass header structure for a pressure transducer employs a cylindrical member fabricated from a borosilicate glass having a thermal expansion coefficient which matches silicon. The glass header has a central aperture which extends from the top to the bottom surface. Positioned about the central aperture are four smaller apertures located at 90 degree intervals and each containing an elongated terminal pin. The pins are of a nail head configuration with a flat top head of a larger diameter than the diameter of the apertures and of the main pin body. Affixed to the flat top surfaces of the terminal pins by means of ball bonding are wires which connect to the terminal areas of a semiconductor pressure transducer which is mounted over the central aperture of the header. In this manner, the glass header serves to electrically and mechanically isolate the semiconductor transducer from the external environment and to further provide isolation of the transducer from voltage and heating effects which are produced during the assembly process necessary to fabricate a complete transducer unit.

20 Claims, 2 Drawing Sheets

4,764,747

GLASS HEADER STRUCTURE FOR A SEMICONDUCTOR PRESSURE TRANSDUCER

This is a continuation of application Ser. No. 746,332, filed June 19, 1985.

BACKGROUND OF THE INVENTION

This invention relates to transducers in general and more particularly to a supporting structure or header for a semiconductor transducer.

Pressure transducers have been widely employed in the prior art for various applications and in various environments. Accordingly, the prior art is replete with a number of patents which employ semiconductor pressure transducers which transducers utilize piezoresistive elements as the force reponsive members. By utilizing the semiconductor transducer, the prior art is enabled to provide a reliable structure which is relatively inexpensive to fabricate and construct while exhibiting reliable operation.

As one can ascertain, such transducers have been employed in different environments which environments subject the transducers to stringent operating conditions such as high temperatures and high pressure while also subjecting the transducer to deleterious substances. For example, such transducers have been used in the automotive field to monitor engine pressure and so on. They are used in the aircraft field to measure aerodynamic pressures. In addition, they are used in many other fields. Apart from the high operating temperatures, the transducers have been subjected to various pollutants and gases which are present in such environments.

It has been a major object of the prior art to provide a reliable transducer which is inexpensive. A major problem in providing such a transducer relates to the support or header for the device. Additional problems relate to economically and reliably affixing lead wires to the small silicon pressure sensing chips used in such transducers. Essentially, a semiconductor pressure transducer comprises an arrangement of piezoresistors which are formed on the surface of a relatively thin diaphragm. The diaphragm which may be fabricated from a semiconductor material or a glass is relatively fragile and must be supported to enable operation. As one can ascertain, the diaphragm is subjected to a pressure or force and deflects according to the magnitude of such pressure. The deflection of the diaphragm causes a change in the resistance of the piezoresistive elements which elements provide an electrical signal proportional to the magnitude of the applied pressure or force.

As indicated, such diaphragms are relatively fragile and are typically supported by a conventional housing or annular structure. For examples of typical support mechanisms for such diaphragms, reference is made to U.S. Pat. No. 4,216,404 entitled HOUSING AND LEAD ARRANGEMENTS FOR ELECTROMECHANICAL TRANSDUCERS, issued Aug. 5, 1980 to A. D. Kurtz and Joseph R. Mallon, Jr. and assigned to Kulite Semiconductor Products, Inc., the assignee herein. Reference is also made to U.S. Pat. No. 3,654,579 entitled ELECTROMECHANICAL TRANSDUCERS AND HOUSINGS, issued on Apr. 4, 1972 to A. D. Kurtz, Joseph R. Mallon, Jr. and Charles Gravel and assigned to the assignee herein.

These patents show various annular members which are used to support a semiconductor pressure transducer and, essentially, are employed to enable the transducer to be used in a typical application. Based on developments made in the transducer technology, new diaphragm configurations have been employed to achieve higher outputs while providing more reliable operation over wide pressure and temperature ranges. An example of a typical structure is shown in U.S. Pat. No. 4,236,137 entitled SEMICONDUCTOR TRANSDUCER EMPLOYING FLEXURE FRAMES, issued on Nov. 25, 1980 to A. D. Kurtz, Joseph R. Mallon, Jr. and Timothy Nunn and assigned to the assignee herein. This patent shows a pressure transducer which employs a semiconductor diaphragm with a top surface having a central boss area of a trapezoidal cross section which is surrounded or framed by a continuous groove. Peripheral sensors are formed on the bottom surface of the diaphragm with a first sensor adjacent the outer edge of the groove and another sensor parallel to the first sensor and adjacent to the inner edge of the groove.

In this structure the groove operates as a stress concentrating area to enable the sensors to provide a relatively large output upon application of a force to the diagragm. Essentially, such devices are relatively small and have to be supported and positioned in a transducer housing in a reliable and efficient manner. It is also very important to effectively isolate the silicon transducer element from the influence of any external stresses. Such stresses may be of mechanical origin or induced by a mismatch in thermal expansion between the silicon and associated materials. Thus it is important in using such structures to employ a header or support housing for the transducer which is extremely rugged, which does not vary in characteristics over wide temperature ranges and which structure will enable the rapid coupling of output leads from the transducer assembly to an external connector to enable efficient fabrication of the final transducer unit. The structure must have an expansion coefficient which is close to that of the semiconductor material.

The housing or support structure should further possess good reliable operating characteristics over a wide temperature range and serve as an efficient insulator member to thereby insulate or electrically isolate the diaphram and associated lead wires from the external environment.

A main purpose of the header or housing is to enable the rapid connection of leads from the transducer assembly to the external connector.

Metal housings are often employed. However, such housings have serious limitations. Metal is a conductor and coatings must be applied to insulate the lead wires from the housing structure. The coatings are expensive to apply and sometimes fail in service. Also metal cannot be used to perfectly match the thermal expansion of silicon over a wide temperature range. For instance, steel has a much higher expansion than silicon and introduces undesirable thermal stresses. Iron-nickel alloys are better and such alloys as Invar and Kovar are sometimes employed but even these materials match imperfectly and only over a limited temperature range.

It is an object of this invention to show a structure which can be inexpensively and reliably manufactured from such a desirable material as borosilicate glass.

It is, therefore, an object of the present invention to provide a header assembly for a pressure transducer which assembly is easy to fabricate and which possesses the ability to allow rapid lead connection while further providing to isolate the diaphram assembly as above indicated.

BRIEF DESCRIPTION OF THE PREFERRED EMBODIMENT

A supporting header for a pressure responsive diaphram transducer, comprising a cylindrical member fabricated from an insulative material and having a central aperture extending from the top to bottom surface, said member further having a plurality of peripheral apertures coaxial with said central aperture and parallel thereto and extending from said top to said bottom surface, each of said apertures accommodating an elongated terminal pin having a flat top nail head portion of greater diameter than said apertures and positioned on said top surface of said cylindrical member, with said elongated pins extending from said bottom surface, a semiconductor diaphragm transducer member positioned on said top surface of said cylindrical member and covering said central aperture, and leads directed from said transducer member and coupled to said flat top nail head portions of said terminal pins.

DETAILED DESCRIPTION OF THE FIGURES

Figure 1:
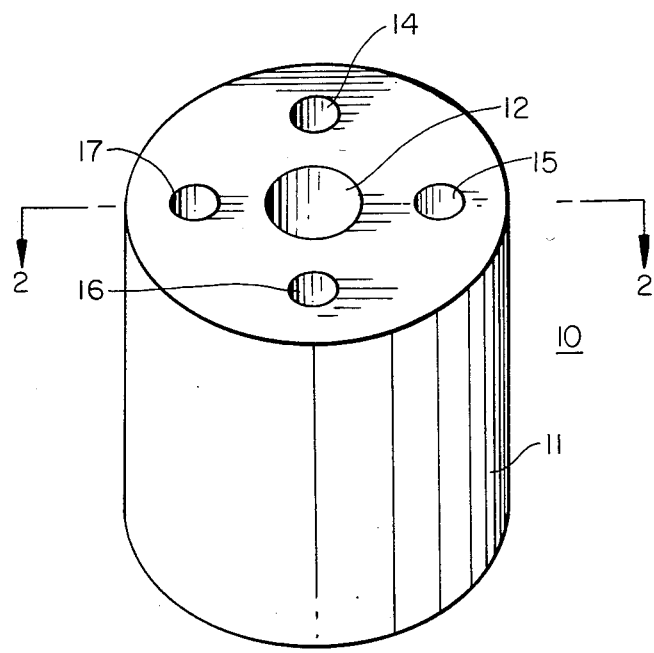
FIG. 1 is a perspective view of a glass tubular structure according to this invention.

Referring to FIG. 1, there is shown a perspective plan view of a tubular structure 10 according to this invention.

Essentially, the tubular structure 10 consists of a cylindrical glass member 11 which member has a central aperture 12 which is surrounded by four coaxial apertures as 14 to 17. The apertures 14 to 17 are spaced 90 degrees apart about the periphery of the central aperture 12. The entire member 11 is fabricated from a borosilicate glass such as Pyrex which is selected to match the expansion coefficient of silicon. The tubular structure 10 is relatively small and, for example, may be approximately 80/1000 inch in length and approximately 125/1000 inch in diameter. The main aperture 12 is approximately 20/1000 in diameter with the peripheral apertures as 14 to 17 being 12/1000 in diameter.

Figure 2:
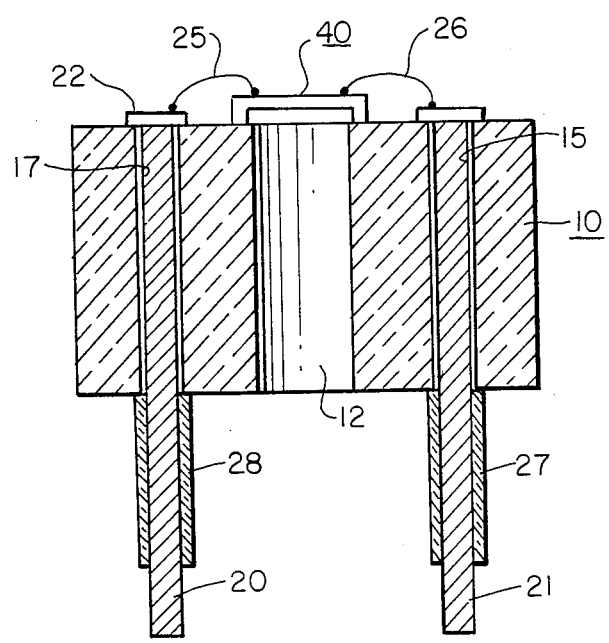
FIG. 2 is a cross sectional view of the tubular structure of FIG. 1 showing terminal pins affixed therein to provide a header according to this invention.

Referring to FIG. 2, there is shown a cross section view of the tubular structure 10.

Into each peripheral aperture as 15 to 17 there are inserted elongated metallic pins as 20 and 21. These pins may be fabricated from nickel or Kovar and gold plated. The pins 20 and 21 have a top head portion 22 which is of a greater diameter than the main body of the pin. The top head portion is approximately 20/1000 inch in diameter, while the main body of the pin is 10/1000 inch. The pins which are approximately ½ inch in length and are inserted into the apertures as shown and extend downwardly from the glass tubular structure 10. The pins are secured within the apertures as 15 and 17 by means of a suitable bonding agent such as an epoxy.

As can be seen from FIG. 2, the elongated top head of the pin is positioned on the surface of the header 10. Positioned over the central aperture 12 is a semiconductor transducer device 40. The device 40 preferably may be a flexure frame transducer such as that shown in U.S. Pat. No. 4,236,137, previously referenced. As is well known, such devices as those shown in that patent contain an array of piezoresistive elements which may form a Wheatstone bridge configuration and which piezoresistive elements monitor pressure by varying their resistance according to the deflection of the semiconductor diaphram upon which they are located. Such Wheatstone bridge arrays as well as other bridge arrays are well known. Hence in regard to this, the piezoresistors are associated with terminals located on the semiconductor diaphrams.

These terminals are connected to wires as 25 and 26 to enable one to bias and gain access to the output of the bridge array. Leads from the transducer which may be gold wires of 1/1000 inch in diameter are directed and bonded to the pins 20 and 21. As one can ascertain, this bonding procedure can be accomplished rather rapidly due to the large area afforded by the large diameter heads of the pins 20 and 21. The leads such as 25 and 26 are secured to the heads of the pins by means of a ball bonding technique using the methods of ultrasonic or thermal compression welding which is a technique widely employed in the semiconductor art. This method contrasts with the method of soldering which is also widely used in the fabrication of such miniature transducers. It has not previously been possible to fabricate such miniature headers suitable for ball bonding using conventional header manufacturing techniques. Thus lead wires were attached by soldering. This method introduces undesirable heat and fluxing agents and makes connections which are operator dependent, expensive, because of their small size, and unreliable. A portion of the pins 20 and 21 as emanating from the bottom surface of the header may be surrounded by insulating tubes such as 27 and 28 which may be fabricated from Mylar or some other suitable insulating structure. The pins also allow one to couple to conducting tubes such as 36 and 37 as shown in FIG. 3 to enable external wires 38 and 39 to be employed and to allow the pins to be crimped to the tubes and the wires.

Crimping has a great advantage in manufacturing because the tubes are readily or economically affixed to the pins and the external lead wires. The crimp provides a reliable mechanical connection which may be reinforced by spot welding, soldering, conductive epoxies and so on. See U.S. Pat. No. 4,513,623 entitled TRANSDUCER HOUSING EMPLOYING CRIMPED LEADS issued on Apr. 30, 1985 to A. D. Kurtz and Joseph R. Mallon, Jr. and assigned to the assignee herein.

In regard to the transducer assembly shown in FIG. 2, the nail head top portions of the pins serve as pressure seals which furthermore cover and pressure seal the peripheral apertures 14 to 17. The extensive area of the heads facilitate pressure sealing and also provide a good flat surface to enable the leads 25 and 26 to be firmly and reliably bonded to the header. Thus a secure connection can be made in a relatively tight space. It can be seen that due to the complex structure of the header and the very small dimensions, the fabrication of the tubular structure cannot be accomplished in a conventional manner. A method of fabrication which involves the assembly and remelting of a series of coaxial Pyrex tubes and rods has been employed for the fabrication of the tubular structure.

Figure 3:
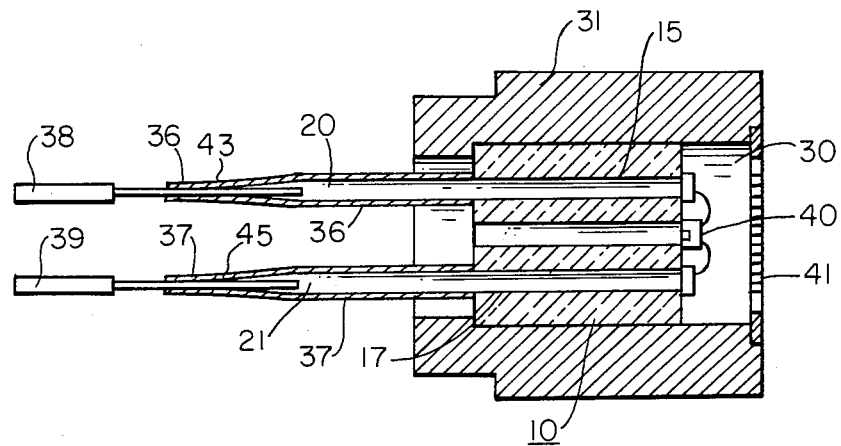
FIG. 3 is a sectional view of a header mounted in a cylindrical structure to form a transducer structure according to this invention.

Referring to FIG. 3, there is shown the header 10 with the semiconductor transducer assembly positioned within an aperture 30 formed in an outer tubular member 31. The outer tubular member 31 is fabricated from a typical metal or ceramic material and has a central aperture 30 of a diameter sufficient to accommodate the glass header structure 10. The header with the semiconductor chip affixed thereto secured in the tubular member 31 forms a completed transducer structure. Such a structure may be used for instance as a probe to measure air pressures in wind tunnel testing of aircraft models. Preferably the annular housing 31 is fabricated from a metal or alloy to allow the same to be welded to an additional housing structure. A suitable material is an iron, nickel, cobalt, sold under the trademark Kovar. This material may be nickel or chrome plated to prevent rusting. The pins as 20 and 21 extend through the header where they are surrounded by tubes as 36 and 37 which may be nickel material. The nickel tubes extend outwardly, and into the other end of the tubes are inserted wires as 38 and 39. A crimp 40 and 41 is then made to secure the pins 20 and 21 to the wires 38 and 39 via the nickel tubes which, therefore, make an electrical connection between pins 20 and 21 and the wires 38 and 39. The crimped areas may then be spot-welded and/or soldered to further provide a rugged and reliable connection both mechanically and electrically. Also conductive epoxy can be employed for this purpose.

As one can ascertain, the crimp provides a good electrical and mechanical connection. It is essentially self-aligning and removes the necessity of performing soldering or any heating operation apart from spot-welding on the pins. In this manner one need not be concerned about heat damaging the pressure transducer 40. Thus as one can see from FIG. 3, the entire assembly can be rapidly fabricated whereby the pressure transducer 40 can be mounted on the glass header 10 with the terminals bonded to the nail heads of the pins. Thus the entire assembly can be completed and then mounted in the annular housing 31 and connected to the external wires as 38 and 39 to form a finished transducer assembly.

The aperture 30 in the housing may be covered by a screen member 41 which screen serves to prevent particles which may be present in the pressure transmitting environment from impinging upon the diaphragm. This screen has small apertures to allow the pressure to act on the transducer element. As can be seen from FIG. 3, the transducer 20 is completely isolated from the connector. The central aperture 12 of the tubular structure 10 serves as a pressure reference port and hence a reference tube may be inserted into aperture 12 and affixed with epoxy to provide a reference pressure for the underside of the diaphragm.

Figure 4:
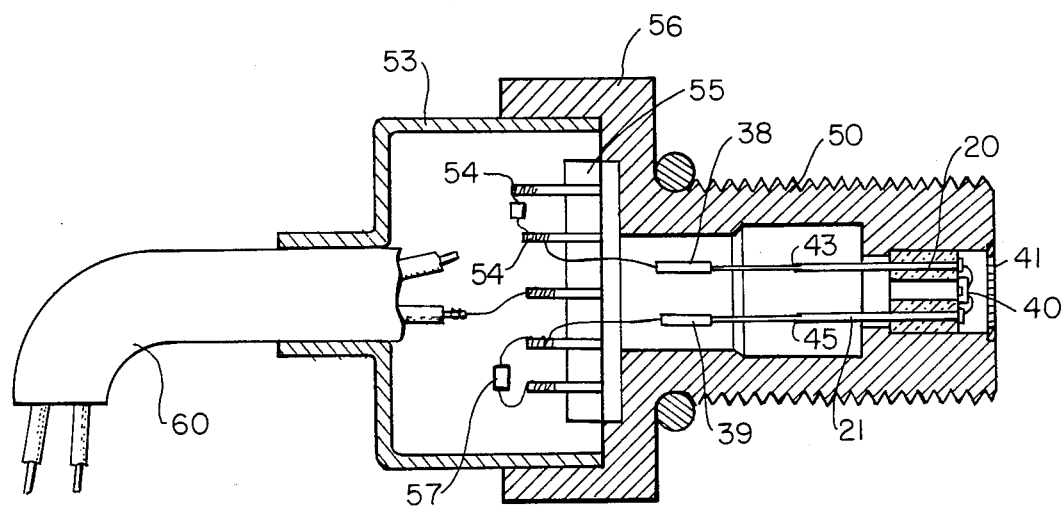
FIG. 4 is a side sectional view of a header structure mounted in a threaded housing to form a threaded transducer structure according to the present invention.

Referring to FIG. 4, there is shown the assembly of FIG. 2 secured mounted in a typical threaded housing structure. Such a structure is a very convenient and is an often employed configuration for a pressure transducer.

The header structure is inserted into the screw housing 50 and affixed with epoxy. The housing 50 terminates in a back flange structure 56 which is coupled to a hollow metal housing 53. The housing 53 has a series of pins as 54 emanating from a terminal board assembly 55. The wires as 38 and 39 which are crimped to the pins 20 and 21 are now soldered to appropriate terminals associated with the terminal board assembly 55 and are now wired to a wire associated with an output cable 60. Alternately, the pins can extend directly to the terminal board and may be soldered or crimp connected directly thereto. The pins as 54 may accomodate compensating components such as resistors 56 and 57 which resistors provide temperature compensation and calibration for the semiconductor arrangement located on the diaphragm structure 20.

The pins as 20 and 21 are preferably fabricated from nickel or some other good conducting material and, as indicated, are inserted into the apertures 15 to 17 of the glass tubular structure 10 where they are then bonded within the apertures 15 to 17 by means of an epoxy or other bonding agent. This provides a good pressure seal which as shown in FIG. 3 prevents any fluid or contaminating substances from entering the housing 50 and 53. The assembly thus described is very simple to fabricate as each subassembly can be separated provided with the entire transducer structure as shown in FIG. 4 completely assembled in a final operation.

The use of the glass header with the associated pins, as indicated, enables one to rapidly connect the appropriate terminals of the pressure transducer to the nail heads of the pins by a ball bonding technique which is a fully automated process. The glass header effectively isolates the transducer assembly from all further manufacturing processes while the pins allow external wires to be crimped and spot welded by means of the nickel coupling tubes. The header provides a very stable base for the transducer chip.

Based on these operations, the pins serve to thermally isolate the transducer structure from any heat generated in completing the transducer as by the soldering of the wires 38 and 39 to the terminal pins as 54 associated with the terminal board 55. The glass header further serves to isolate the structure from voltage transients as well as to provide thermal and mechanical stress isolation from the main housing as 50 and 53. A major consideration is the fact that the entire transducer structure as shown in FIG. 3 can be assembled independently and then coupled to the housing structure shown in FIG. 4. This saves a great deal of assembly time which results in a substantial savings in cost.

We claim:

1. A pressure responsive diaphragm transducer assembly comprising:
a cylindrical member fabricated from glass insulative material and having a central aperture extending from the top to bottom surface, said member further having a plurality of peripheral apertures coaxial with said central aperture and parallel thereto and extending from said top to said bottom surface, a plurality of elongated terminal pins each having a flat top nail head portion of a greater diameter than said peripheral apertures disposed in respective ones of said plurality of said peripheral apertures, each of said plurality of elongated terminal pins being positioned on said top surface of said cylindrical member with said flat top nail head portion completely overlying and sealing an associated peripheral aperture and said elongated pin extending through said associated aperture and from said bottom surface, a semiconductor diaphragm transducer member positioned on said top surface of said cylindrical member and covering said central aperture, and said transducer member having fine leads extending therefrom over said top surface and bonded to said flat top nail head portions of selected ones of said plurality of elongated terminals pins with said terminal pins serving to pressure seal each peripheral aperture due to said flat top nail head portion said pins further serving to thermally insulate said transducer member from heat generated in bonding said fine leads to said nail head portions.

2. The transducer assembly according to claim 1 wherein said cylindrical member is fabricated from a borosilicate glass as Pyrex having a comparable expansion coefficient with said semiconductor diaphragm.

3. The transducer assembly according to claim 1 wherein said central aperture is of a larger diameter than said peripheral aperture.

4. The transducer assembly according to claim 1 wherein said plurality of peripheral apertures are four peripheral apertures coaxial with said central aperture and spaced thereabout at 90 degree intervals.

5. The transducer assembly according to claim 1 wherein said elongated terminal pins are fabricated from a good conducting material.

6. The transducer assembly according to claim 1 wherein said elongated terminal pins are fabricated from nickel.

7. The transducer assembly according to claim 1 wherein said leads directed from said transducer member are ball bonded to said flat top nail head portions.

8. The transducer assembly according to claim 1 wherein said semiconductor diaphragm transducer member is a flexure frame semiconductor transducer.

9. The transducer assembly according to claim 1 further including an outer annular housing member having a central aperture of a given diameter, with said cylindrical member located within said aperture and surrounded by said outer annular housing.

10. The transducer assembly according to claim 9 wherein said outer annular member is fabricated from a ceramic material.

11. The transducer assembly according to claim 1 wherein said elongated terminal pins are bonded to said cylindrical housing within said apertures to provide a pressure seal.

12. The transducer assembly according to claim 11 wherein said terminal pins are bonded by an epoxy.

13. The transducer assembly according to claim 1 wherein said elongated terminal pins as extending from said bottom surface are surrounded by elongated tubes.

14. The transducer assembly according to claim 13 wherein said elongated tubes are fabricated from an insulating material.

15. The transducer assembly according to claim 13 wherein said elongated tubes are fabricated from a conducting material and extend outwardly from said pins to enable insertion of a wire in to said tubes whereby said pins can be coupled to said wire by a crimp joint formed on said tubes.

16. The transducer assembly according to claim 15 wherein said tubes are fabricated from nickel.

17. The transducer assembly according to claim 9 wherein said outer annular member is fabricated from a metal material.

18. A pressure transducer apparatus, comprising:
an outer housing member having a central aperture of a given diameter,
a cylindrical member fabricated from glass insulative material and having a central aperture extending from the top to bottom surface, said member further having a plurality of peripheral apertures coaxial with said central aperture and parallel thereto and extending from said top to said bottom surface, a plurality of elongated terminal pins each having a flat top nail head portion of a greater diameter than said peripheral apertures disposed in respective ones of said plurality of said peripheral apertures, each of said plurality of elongated terminals pins being positioned on said top surface of said cylindrical member with said flat top nail head portion completely overlying and sealing an associated peripheral aperture and said elongated pin extending through said associated aperture and from said bottom surface, a semiconductor diaphragm transducer member positioned on said top surface of said cylindrical member and covering said central aperture, and said transducer member having fine leads extending therefrom over said top surface and bonded to said flat top nail head portions of said terminal pins, with said terminal pins serving to pressure seal each peripheral aperture due to said flat top nail head portion, said pins further serving to thermally insulate said transducer member from heat generated in coupling said leads to said nail head portions,
said cylindrical member being located within said aperture of said outer housing with said cylindrical member surrounded by said outer housing and said semiconductor diaphragm transducer member being visible via said central aperture of said outer housing.

19. The pressure transducer apparatus according to claim 18, wherein said outer housing has an outer peripheral thread for insertion of said transducer into a correspondingly threaded aperture.

20. The pressure transducer apparatus according to claim 18, wherein said outer housing is fabricated from a metal.

* * * * *